United States Patent
Kim

(10) Patent No.: US 7,012,368 B2
(45) Date of Patent: Mar. 14, 2006

(54) ORGANIC ELECTRO LUMINESCENCE DEVICE HAVING MULTILAYER CATHODE

(75) Inventor: Kyung Man Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 129 days.

(21) Appl. No.: 10/600,590

(22) Filed: Jun. 23, 2003

(65) Prior Publication Data

US 2004/0245919 A1 Dec. 9, 2004

(30) Foreign Application Priority Data

Nov. 19, 2002 (KR) .................. 10-2002-0071990

(51) Int. Cl.
  *H05B 33/00* (2006.01)
  *H05B 33/04* (2006.01)
(52) U.S. Cl. .................. 313/506; 313/504; 313/512; 428/690; 428/691
(58) Field of Classification Search ........ 313/504–512; 428/690, 691
See application file for complete search history.

(56) References Cited

U.S. PATENT DOCUMENTS

| | | | |
|---|---|---|---|
| 5,652,067 A * | 7/1997 | Ito et al. ................ | 428/690 |
| 5,702,565 A | 12/1997 | Wu et al. | |
| 5,731,661 A * | 3/1998 | So et al. ................ | 313/504 |
| 6,255,774 B1 * | 7/2001 | Pichler ................ | 313/504 |
| 6,707,248 B1 * | 3/2004 | Burroughes et al. ...... | 313/504 |
| 2003/0224204 A1 * | 12/2003 | Raychaudhuri et al. .... | 428/690 |

* cited by examiner

Primary Examiner—Karabi Guharay
Assistant Examiner—Sikha Roy
(74) Attorney, Agent, or Firm—McKenna Long & Aldridge LLP

(57) ABSTRACT

There is provided an organic electro luminescence device which includes at least one thin organic layer between an anode substrate and a cathode. The cathode includes first to fourth electrodes stacked on the thin organic layer. The first and third electrodes are formed of alkali metal or alkali earth metal, and the second and fourth electrodes are formed of aluminum (Al) or silver (Ag).

20 Claims, 2 Drawing Sheets

ORGANIC ELECTRO LUMINESCENCE DEVICE HAVING MULTILAYER CATHODE

This application claims the benefit of Korean Patent Application No. 71990-2002, filed on Nov. 19, 2002, which is hereby incorporated by reference for all purposes as if fully set forth herein.

BACKGROUND OF THE INVENTION

1. Field of the Invention

The present invention relates to an organic electro luminescence device, and more particularly, to an organic electro luminescence device in which a cathode is provided with first to fourth electrodes.

2. Discussion of the Related Art

Recently, with a tendency for a display to be large-sized, there is an increasing demand for flat-panel displays occupying less space. One of these flat-panel displays is an organic electro luminescence device (hereinafter, referred to as an "organic EL device") and a technology of the EL device has been rapidly developed. Several prototype products have already been demonstrated.

The organic EL device includes an anode substrate formed of a transparent electrode such as indium tin oxide (ITO), a cathode made of metal (Ca, Li, Al:Li, Mg:Ag, etc) having low work function, and a thin organic layer formed between the anode substrate and the cathode. If a forward voltage is applied to such an organic EL device, holes and electrons are injected at the anode substrate and the cathode, respectively. The injected holes and electrons are combined with each other to form excitons. The excitons provide a radiative recombination, which is called an electro luminescence phenomenon.

Here, material for the thin organic layer can be classified into low polymer material or high polymer material. In the case of the low polymer material, the thin organic layer is formed on a substrate using a vapor deposition process, and in the case of the high polymer material, it is formed on a substrate using a spin coating process. In order to operate elements at a low voltage, the thin organic layer is formed very thinly (about 1000 Å thick). The thin organic layer should be uniform and should not have defects such as a pin hole.

Additionally, although the thin organic layer can be formed of a single material, it is generally formed in multi-layer structure of several organic materials.

The reason for forming the organic device in a multi-layer structure is that the holes and the electrons can be effectively transferred to an organic light-emitting layer (EML) when using a hole transport layer (HTL) and an electron transport layer (ETL), since mobility of the hole is greatly different from that of the electron in the organic material.

If hole density and electron density are balanced in the organic light-emitting layer (EML), luminous efficiency is increased.

Additionally, in some cases, an energy barrier of the hole injection can be reduced if a hole injection layer (HIL) made of material such as conductive polymer is further formed between the anode substrate and the hole transport layer. An energy barrier of the electron injection can be also reduced if a buffer layer (an electron injection layer (EIL)), such as LiF layer of about 5 Å to 10 Å thick, is further formed between the cathode and the electron transport layer, such that luminous efficiency is enhanced and a driving voltage is reduced.

In the organic EL device, organic material for the thin organic layer inserted between both electrodes has an advantage in that various types of material can be easily synthesized because of a simple synthesis path and color tuning is possible. The organic material is classified into low polymer material and high polymer material.

In case the thin organic layer is formed of the low polymer material, a driving voltage is lowered and an advantage of a thin layer about 100 nm thick is obtained. Also, it is possible to obtain a high resolution and reproduce a natural color. Meanwhile, in case the thin organic layer is formed of the high polymer material, thermal stability and a low driving voltage, as well as a flexible characteristic, can be obtained, and a large-sized device can be manufactured at a low cost. Also, a polymer chain of one dimension is arranged to emit polarized light and an on-off speed is fast.

Further, the organic EL device has a cathode made of alkali metal having an excellent electron injection characteristic to enhance brightness of the organic EL device and employs material with high luminous efficiency as material for the organic light-emitting layer.

However, the organic EL device according to the related art has a disadvantage that so-called dark spots frequently appear on a display panel. A dark spot constitutes an electro non-luminescence region caused by degradation of the material characteristics of the thin organic layer and/or a stripping of the cathode.

The degradation of material characteristic of the thin organic layer and/or the stripping of the cathode are/is caused due to an existence of oxygen ($O_2$) or moisture ($H_2O$) contained in air around the organic EL device. This causes a degradation of luminescence characteristic such as brightness and chromaticity of the organic EL device.

Several measures have been taken so as to resolve these problems. One of them is to remove moisture contained in air around the organic EL device using an absorbent provided in an inner space of the organic EL device.

In more detail, in order to efficiently remove the moisture contained in air around the sealed space of the organic EL device, the absorbent is placed to face the cathode in the sealed space.

FIG. 1 is a sectional view of an organic EL device according to the related art.

Referring to FIG. 1, the organic EL device according to the related art includes an anode (a transparent electrode) substrate 12 formed of transparent ITO, a thin organic layer 14 and a cathode 16 that are sequentially deposited on the transparent electrode substrate 12. As described above, the thin organic layer 14 includes a hole injection/transport layer, an organic light-emitting layer and an electron injection/transport layer.

Additionally, in order to prevent the degradation of the luminescence characteristics of the thin organic layer 14 and the stripping of the cathode, an absorbent 20 for removing moisture is fixedly adhered to an inner surface of a sealing member 18 defining an inner space.

Meanwhile, a protection layer (not shown) can be formed to prevent oxygen or moisture from permeating the thin organic layer 14 or the cathode 16, and the protection layer includes the absorbent or other materials suitable to absorb or consume oxygen or moisture. Additionally, the protection layer can be stacked on outer surfaces of the anode substrate 12, the thin organic layer 14 and the cathode 16 of the organic EL device.

The cathode 16 may be generally formed with one kind of metal. Meanwhile, in order to enhance luminous efficiency, the cathode 16 may be formed with two electrodes. In other words, a first electrode is formed of a metal having a low work function and then a second electrode acting as a protection metal layer is formed on the first electrode to protect the first electrode.

However, in case the first electrode is formed of a metal having a low work function and then the second electrode acting as a protection metal layer is formed on the first electrode to protect the first electrode, oxygen or hydrogen may permeate the second electrode due to strong reactivity of the first electrode with respect to oxygen or moisture, and then react with the first electrode. In some cases, oxygen or moisture may permeate an interfacial surface of the thin organic layer.

SUMMARY OF THE INVENTION

Accordingly, the present invention is directed to an organic electro luminescence device that substantially obviates one or more problems due to limitations and disadvantages of the related art.

An advantage of the present invention to provide an organic electro luminescence device in which a cathode is made of first to fourth electrodes and thus degradation of the device due to oxygen and/or moisture is prevented to thereby extend the lifetime of the device.

Additional features and advantages of the invention will be set forth in part in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with purpose of the present invention, as embodied and broadly described, an organic electro luminescence device including components stacked in a multi-layer structure, in which the components include an anode substrate, a thin organic layer and a cathode that are sequentially formed. The thin organic layer is provided with a hole injection/transport layer, an organic light-emitting layer and an electron injection/transport layer. The cathode includes first to fourth electrodes stacked on the thin organic layer.

In another aspect of the present invention, there is provided method of forming an organic electro luminescence device including providing an anode substrate, a thin organic layer and a cathode that are sequentially formed. The thin organic layer is provided with a hole injection/transport layer, an organic light-emitting layer and an electron injection/transport layer. The cathode includes first to fourth electrodes stacked on the thin organic layer.

In another aspect of the present invention, there is provided an organic electro luminescence device including at least one thin organic layer between an anode substrate and a cathode. The cathode includes first to fourth electrodes stacked on the thin organic layer, the first and third electrodes being formed of alkali metal or alkali earth metal, and the second and fourth electrodes being formed of aluminum (Al) or silver (Ag).

It is to be understood that both the foregoing general description and the following detailed description of the present invention are exemplary and explanatory and are intended to provide further explanation of the present invention as claimed.

BRIEF DESCRIPTION OF THE DRAWINGS

The accompanying drawings, which are included to provide a further understanding of the present invention and are incorporated in and constitute a part of this specification, illustrate embodiments of the present invention and together with the description serve to explain the principles of the invention.

In the drawings.

DETAILED DESCRIPTION OF THE ILLUSTRATED EMBODIMENTS

Figure 1:
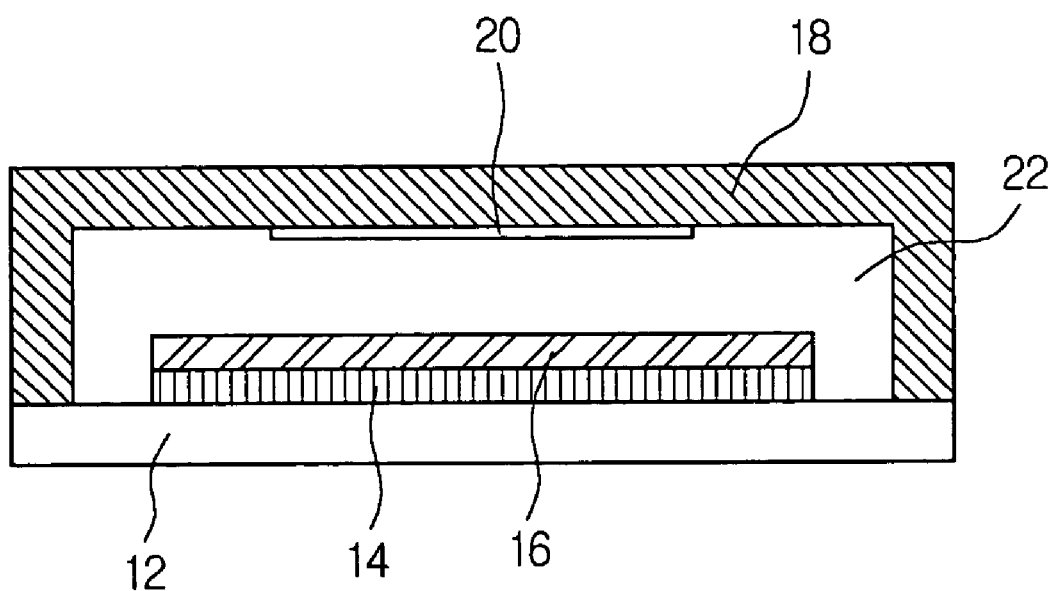
FIG. 1 is a sectional view of an organic EL device according to the related art.

Reference will now be made in detail to embodiments of the present invention, examples of which are illustrated in the accompanying drawings. Where possible, like reference numerals will be used to indicate like parts.

Figure 2:
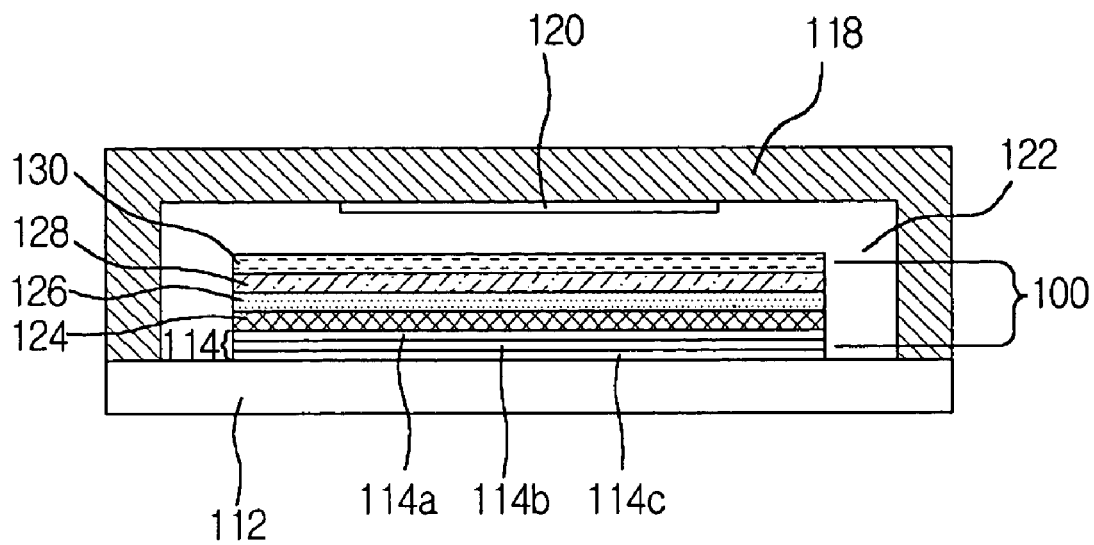
FIG. 2 is a sectional view of an organic EL device according to an embodiment of the present invention.

FIG. 2 is a sectional view of an organic EL device according to an embodiment of the present invention.

Referring to FIG. 2, the organic EL device of the present invention includes an anode (a transparent electrode) substrate 112 formed of transparent ITO, a thin organic layer 114 and a cathode 100 having a plurality of layers 124 to 130 that are sequentially formed on the transparent electrode substrate 112. The thin organic layer 114 includes a hole injection/transport layer 114a, an organic light-emitting layer 114b and an electron injection/transport layer 114c. In order to prevent the degradation of the luminescence characteristics of the thin organic layer 114 and the stripping of the cathode 100, components are enclosed by a sealing member 118 defining an inner space, and an absorbent 120 for removing moisture is adhered to the sealing member 118.

Meanwhile, according to the related art, the cathode is formed of one kind of metal or two electrodes. In case of using two electrodes, in order to enhance luminous efficiency, a first electrode is formed of a metal having a low work function and then a second electrode acting as a protection metal layer is formed on the first electrode so as to protect the first electrode. On the contrary, the present invention is characterized in that the cathode is provided with a first electrode 124 to a fourth electrode 130.

At this time, the first and third electrodes 124 and 128 are formed of alkali metal or alkali earth metal, and the second and fourth electrodes 126 and 130 are formed of aluminum (Al) or silver (Ag).

The third electrode 128 and the fourth electrode 130 act as a protection layer to prevent the permeation of oxygen or moisture, in which the third electrode 128 is formed of alkali metal or alkali earth metal having strong reactivity with oxygen and moisture, such as calcium (Ca), barium (Ba) and cesium (Cs).

According to the cathode of the related art, oxygen or moisture may permeate the first electrode 124 through the second electrode 126. According to the cathode of the present invention, however, even when oxygen or moisture permeates the fourth electrode 130, the third electrode 128 of alkali-based metal traps the permeated oxygen or moisture. Therefore, oxygen or moisture stops its progress before permeating the second electrode 126, thereby preventing an oxidation of the first electrode 124. As a result, malfunctions resulting from the oxidation of the first electrode 124 can be reduced, and thus the lifetime of the device can be extended.

Further, all components of the thin organic layer 114 and the cathode 124 to 130 that are sequentially formed on the anode substrate 112 are sealed by a combination of the anode substrate 112 and the sealing member 118. An absorbent 120 facing the fourth electrode 130 is provided within the inner space formed by the sealing member 118 and the anode substrate 112 to remove moisture existing in the sealed space. The absorbent 120 may be adhered to the surface of the sealing member 118 within the inner space.

Here, the absorbent 120 is formed of barium oxide (BaO) or calcium oxide (CaO), and the sealed space can be filled with inert gas 122 such as nitrogen gas and argon gas.

Figure 3:
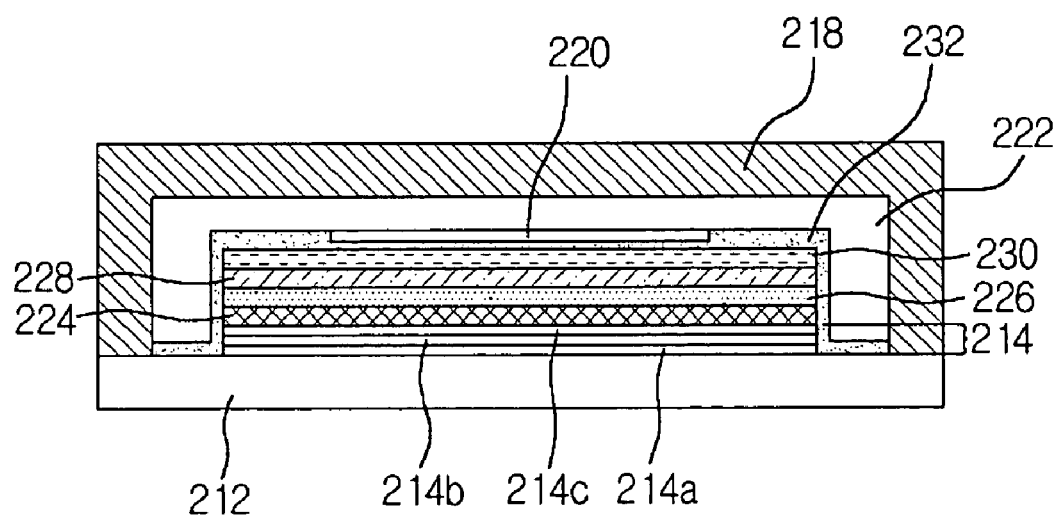
FIG. 3 is a section view of an organic EL device according to another embodiment of the present invention.

FIG. 3 is a sectional view of an organic EL device according to another embodiment of the present invention.

Referring to FIG. 3, compared with the organic EL device of FIG. 2, the organic EL device according to another embodiment of the present invention is characterized in that a protection layer 232 covers the components 214 to 230, and an absorbent 220 is directly fixed to an upper surface of the protection layer 232.

In other words, the organic EL device of FIG. 3 includes an anode substrate 212 formed of ITO; a thin organic layer 214 having a hole injection/transport layer 214a, an organic light-emitting layer 214b and an electron transport layer 214c; and a cathode 200 having first to fourth electrodes 224 to 230. Further, the protection layer 232 is coated on the resultant structure including the above components and the absorbent 220 is directly fixed on the upper surface of the protection layer 232.

Further, in order to prevent the degradation of the luminescence characteristics of the thin organic layer 214 and the stripping of the cathode, the components formed on the anode substrate 212 are sealed within an inner space defined by a combination of the sealing member 218 and the anode substrate 212.

Here, the absorbent 120 or 220 is formed as a powder or in a layer. The protection layer 232 is formed of an organic compound used in the electron transport layer of the thin organic layer 214 and/or its inducing substance, fluorine-based lubricant such as perfluoropolyether (PFPE), diamond-like carbon (DLC) deposited at a low temperature using a chemical vapor deposition (CVD) process or a sputtering process, and the like.

Additionally, the absorbent 120 or 220 is formed of, for example, chemical compound that can be maintained in a solid state or become a gel state even when absorbing moisture. The absorbent 120 or 220 can be formed as a powder or in a thin-layered shape. The chemical compound can be one of barium oxide (BaO) and calcium oxide (CaO).

As one method of adhering the absorbent 220 to the protection layer 232, a porous seat formed of polyethylene resin or 4-fluoroethylene or similar material covers the protection layer 232 and has an end portion fixed to the upper surface of the protection layer 232 using a heat-resistant adhesive.

Further, the sealing member 118 or 218 may be adhered to the anode substrate 212 using an ultraviolet hardening epoxy adhesive (hereinafter, referred to as an "UV hardening epoxy adhesive") that is hardened when radiated ultraviolet rays are applied thereto.

At this time, the organic EL device has an inner space filled with the inert gas 122 or 222, such as nitrogen gas and argon gas. Using the UV hardening epoxy adhesive, the anode substrate 112 or 212 is adhered to the sealing member 218 through a region contacted with the sealing member 118 or 218 to thereby seal the inner space of the organic EL device.

As described above, the organic EL device according to the present invention has an advantage that can prevent the degradation of the device due to oxygen and/or moisture and extend the lifetime of the device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electro luminescence device, comprising:
   an anode substrate;
   a thin organic layer having a hole injection/transport layer, an organic light-emitting layer and an electron injection/transport layer; and
   a cathode, wherein the anode substrate, the thin organic layer and the cathode are sequentially stacked and wherein the cathode comprises first to fourth electrodes stacked on the thin organic layer.

2. The organic electro luminescence device of claim 1, wherein the first electrode includes a first metal and the third electrode includes a second metal.

3. The organic electro luminescence device of claim 2, wherein the first metal is one of an alkali metal and an alkali earth metal.

4. The organic electro luminescence device of claim 2, wherein the second metal includes one of an alkali metal and an alkali earth metal.

5. The organic electro luminescence device of claim 2, wherein the first metal and the second metal are the same and include an alkali metal.

6. The organic electro luminescence device of claim 2, wherein the first and second metal are the same and include an alkali earth metal.

7. The organic electro luminescence device of claim 2, wherein the first metal and the second metal are not the same.

8. The organic electro luminescence device of claim 1, wherein the second electrode includes a first conducting metal and fourth electrode include a second conducting metal.

9. The organic electro luminescence device of claim 8, wherein the first conducting metal and the second conducting metal are the same.

10. The organic electro luminescence device of claim 8, wherein the first conducting metal and the second conducting metal are not the same.

11. The organic electro luminescence device of claim 8, wherein the first conducting metal includes one of aluminum (Al) and silver (Ag) and wherein the second conducting metal includes one of aluminum (Al) and silver (Ag).

12. The organic electro luminescence device of claim 1, further comprising a sealing member combined with the anode substrate to enclose the anode substrate, the thin organic layer and the cathode.

13. The organic electro luminescence device of claim 12, further comprising an absorbent adhered to the sealing member, the absorbent being provided at a position facing the fourth electrode.

14. The organic electro luminescence device of claim 1, further comprising: a protection layer is coated on the anode substrate, the thin organic layer and the cathode.

15. The organic electro luminescence device of claim 14, further comprising: an absorbent on an upper surface of the protection layer.

16. A method of forming organic electro luminescence device, comprising:

providing an anode substrate;

providing a thin organic layer on the anode substrate, the thin organic layer having a hole injection/transport layer, an organic light-emitting layer and an electron injection/transport layer; and forming a cathode on the thin organic layer, wherein the cathode comprises first to fourth electrodes stacked on the thin organic layer.

17. The method of claim 16, further comprising: forming a sealing member over the anode substrate, the thin organic layer and the cathode such that the sealing member together with the anode substrate encloses the thin organic layer and the cathode.

18. The method of claim 17, further comprising: forming an absorbent adhered to the sealing member, the absorbent being provided at a position facing the fourth electrode.

19. The method of claim 16, further comprising: forming a protection layer is coated on the anode substrate, the thin organic layer and the cathode.

20. The method of claim 19, further comprising: forming an absorbent on an upper surface of the protection layer.

* * * * *